United States Patent
Li

(10) Patent No.: US 11,417,859 B2
(45) Date of Patent: Aug. 16, 2022

(54) DISPLAY STRUCTURE

(71) Applicant: WUHAN CHINA STAR OPTOELECTRONICS SEMICONDUCTOR DISPLAY TECHNOLOGY CO., LTD., Hubei (CN)

(72) Inventor: Zhao Li, Hubei (CN)

(73) Assignee: WUHAN CHINA STAR OPTOELECTRONICS SEMICONDUCTOR DISPLAY TECHNOLOGY CO., LTD., Hubein (CN)

( * ) Notice: Subject to any disclaimer, the term of this patent is extended or adjusted under 35 U.S.C. 154(b) by 283 days.

(21) Appl. No.: 16/644,201

(22) PCT Filed: Feb. 18, 2020

(86) PCT No.: PCT/CN2020/075758
§ 371 (c)(1),
(2) Date: Mar. 4, 2020

(87) PCT Pub. No.: WO2021/042678
PCT Pub. Date: Mar. 11, 2021

(65) Prior Publication Data
US 2021/0408463 A1 Dec. 30, 2021

(30) Foreign Application Priority Data
Sep. 2, 2019 (CN) .......................... 201910821292.8

(51) Int. Cl.
*H01L 51/52* (2006.01)

(52) U.S. Cl.
CPC ...... *H01L 51/5253* (2013.01); *H01L 51/5231* (2013.01); *H01L 51/5271* (2013.01)

(58) Field of Classification Search
None
See application file for complete search history.

(56) References Cited

U.S. PATENT DOCUMENTS

| 6,849,869 B1 | 2/2005 | O'Regan et al. |
| 2004/0256983 A1 | 12/2004 | Hung et al. |
| (Continued) | | |

FOREIGN PATENT DOCUMENTS

| CN | 1373908 A | 10/2002 |
| CN | 101123838 A | 2/2008 |
| (Continued) | | |

*Primary Examiner* — Khaja Ahmad
(74) *Attorney, Agent, or Firm* — Hamre, Schumann, Mueller & Larson, P.C.

(57) ABSTRACT

A display structure is provided. The display structure includes: an array layer; a transparent anode layer disposed on the array layer; a light-emitting element layer disposed on the transparent anode layer; a light reflective layer disposed on the light-emitting element layer and sequentially including a reflective cathode layer, a cathode protection layer, and a reflective metal layer; and an encapsulation layer disposed on the light reflective layer. A reflective metal layer is added between the encapsulation layer and the reflective cathode layer, thereby increasing a light-emitting efficiency of a bottom-emission type organic light-emitting diode, further enhancing the moisture and oxygen block capability of the OLED device, and effectively improving the optical properties and the moisture and oxygen resistance of OLED display panels.

11 Claims, 1 Drawing Sheet

(56) References Cited

U.S. PATENT DOCUMENTS

| | | |
|---|---|---|
| 2005/0007517 A1 | 1/2005 | Anandan |
| 2006/0280964 A1 | 12/2006 | Liu |
| 2008/0038584 A1 | 2/2008 | Akai |
| 2012/0119199 A1 | 5/2012 | Okamoto et al. |
| 2013/0193425 A1* | 8/2013 | Smith ................. H01L 51/5203 257/40 |
| 2014/0117337 A1* | 5/2014 | Jung ................... H01L 51/5278 257/40 |
| 2014/0183475 A1* | 7/2014 | Song ................... H01L 51/5278 257/40 |
| 2016/0155988 A1* | 6/2016 | Kuroki ................ H01L 51/0097 257/40 |
| 2017/0033320 A1* | 2/2017 | Harkema ............ H01L 51/0096 |
| 2017/0365217 A1* | 12/2017 | An ...................... H01L 27/3279 |
| 2019/0372053 A1 | 12/2019 | Li |

FOREIGN PATENT DOCUMENTS

| | | |
|---|---|---|
| CN | 101162762 A | 4/2008 |
| CN | 104124365 A | 10/2014 |
| CN | 107248550 A | 10/2017 |
| CN | 109065755 A | 12/2018 |
| CN | 109256491 A | 1/2019 |
| CN | 110098351 A | 8/2019 |
| CN | 110690258 A | 1/2020 |

* cited by examiner

DISPLAY STRUCTURE

FIELD OF INVENTION

The present invention relates to a display structure, and more particularly, to a display structure for improving encapsulation reliability and light-emitting efficiency.

BACKGROUND OF INVENTION

In recent years, organic light-emitting diode (OLED) display technology develops rapidly. OLED products have attracted more and more attention and applications, due to their advantages, such as light weights, fast response times, wide view angles, high contrast, bendability, etc., which are mainly used in many display fields, such as mobile phones, tablets, televisions, etc.

A light-emitting principle of an OLED display device is that: an OLED light-emitting layer deposits between two electrodes, a current is applied to the OLED light-emitting layer, and electron holes of a positive electrode and electrons of a cathode electrode combine in the light-emitting layer to generate photons and cause light emission. Because OLED materials and devices are extremely sensitive to external moisture and oxygen, moisture and oxygen entering an inside of the OLED device cause the OLED device to oxidize, resulting in reduced performances, such as service lifespan. Currently, the industry mostly uses a thin film encapsulation method, that is, a single-layer or multi-layer organic or inorganic films cover the OLED light-emitting layer to achieve the purpose of blocking moisture and oxygen. However, the current encapsulation method has limited ability to isolate moisture and oxygen. Under a high temperature and high humidity environment, an OLED display panel fails due to intrusion of moisture and oxygen from one side of the encapsulation layer. Therefore, the encapsulation performance of the OLED display panel needs to be improved. Although a light output efficiency of the OLED display panel can reach more than 90%, some light is lost when the light passes through the electrodes, and the light output efficiency of the OLED display panel needs to be further improved.

Therefore, it is necessary to provide a display structure to solve the problems existing in the prior art.

Technical Problem

A light-emitting principle of an OLED display device is that: an OLED light-emitting layer deposits between two electrodes, a current is applied to the OLED light-emitting layer, and electron holes of a positive electrode and electrons of a cathode electrode combine in the light-emitting layer to generate photons and cause light emission. Because OLED materials and devices are extremely sensitive to external moisture and oxygen, moisture and oxygen entering an inside of the OLED device cause the OLED device to oxidize, resulting in reduced performances, such as service lifespan. Currently, the industry mostly uses a thin film encapsulation method, that is, a single-layer or multi-layer organic or inorganic films cover the OLED light-emitting layer to achieve the purpose of blocking moisture and oxygen. However, the current encapsulation method has limited ability to isolate moisture and oxygen. Under a high temperature and high humidity environment, an OLED display panel fails due to intrusion of moisture and oxygen from one side of the encapsulation layer. Therefore, the encapsulation performance of the OLED display panel needs to be improved. Although a light output efficiency of the OLED display panel can reach more than 90%, some light is lost when the light passes through the electrodes, and the light output efficiency of the OLED display panel needs to be further improved.

SUMMARY OF INVENTION

In view of above, the present invention provides a display structure to solve the problems that the existing OLED display panel encapsulation method has limited ability to isolate moisture and oxygen, an OLED display panel fails due to intrusion of moisture and oxygen from one side of the encapsulation layer under a high temperature and high humidity environment, and although a light output efficiency of the OLED display panel can reach more than 90%, some light is lost when the light passes through the electrodes, and the light output efficiency of the OLED display panel needs to be further improved.

A main object of the present invention is to provide a display structure, in which a reflective metal layer can be added between an encapsulation layer and a reflective cathode layer, thereby increasing a light-emitting efficiency of bottom-emission type OLEDs, and moisture and oxygen barrier ability of the OLED devices are enhanced, which effectively improves the optical performance and moisture/oxygen resistance of the OLED display panel.

A secondary object of the present invention is to provide a display structure, in which a reflective metal layer can be added between an encapsulation layer and a reflective cathode layer. The reflective metal layer can enhance the light reflection of the reflective cathode layer, and can improve the barrier of the encapsulation layer from moisture and oxygen invading the OLED devices. The OLED display panel structure provided by the present invention not only increases the light-emitting efficiency of the bottom-emission type OLED devices, but also enhances the moisture and oxygen barrier ability, which effectively improves the optical performance and moisture and oxygen resistance of the OLED display panel.

To achieve the foregoing objects of the present invention, an embodiment of the present invention provides a display structure including:

an array layer;

a transparent anode layer disposed on the array layer;

a light-emitting element layer disposed on the transparent anode layer;

a light reflective layer disposed on the light-emitting element layer, wherein the light reflective layer sequentially includes a reflective cathode layer, a cathode protection layer, and a reflective metal layer;

a first silicon nitride layer disposed on the reflective metal layer;

a polymethylmethacrylate layer disposed on the first silicon nitride layer; and a second silicon nitride layer disposed on the polymethylmethacrylate layer.

In one embodiment of the invention, the reflective cathode layer is made of a first highly reflective metal material, and the reflective cathode layer has a thickness ranging from 50 to 100 nanometers; and the reflective metal layer is made of a second highly reflective metal material, and the reflective metal layer has a thickness ranging from 100 to 500 nanometers and has a reflectance more than 95%.

In one embodiment of the invention, the cathode protection layer is a lithium fluoride layer, and has a thickness ranging from 50 to 100 nanometers.

In one embodiment of the invention, the light-emitting element layer is a bottom-emission type light-emitting element layer.

Furthermore, another embodiment of the present invention provides a display structure, including:

an array layer;

a transparent anode layer disposed on the array layer;

a light-emitting element layer disposed on the transparent anode layer;

a light reflective layer disposed on the light-emitting element layer, wherein the light reflective layer sequentially includes a reflective cathode layer, a cathode protection layer, and a reflective metal layer; and an encapsulation layer disposed on the light reflective layer.

The display structure according to claim 5, wherein the encapsulation layer includes:

a first silicon nitride layer disposed on the reflective metal layer;

a polymethylmethacrylate layer disposed on the first silicon nitride layer; and a second silicon nitride layer disposed on the polymethylmethacrylate layer.

In one embodiment of the invention, the reflective cathode layer is made of a first highly reflective metal material, and the reflective cathode layer has a thickness ranging from 50 to 100 nanometers; and the reflective metal layer is made of a second highly reflective metal material, and the reflective metal layer has a thickness ranging from 100 to 500 nanometers and has a reflectance more than 95%.

In one embodiment of the invention, the cathode protection layer is a lithium fluoride layer, and has a thickness ranging from 50 to 100 nanometers.

In one embodiment of the invention, the light-emitting element layer is a bottom-emission type light-emitting element layer.

Furthermore, yet another embodiment of the present invention provides a display structure, including:

an array substrate;

a transparent anode layer disposed on the array substrate;

a light-emitting element layer disposed on the transparent anode layer;

a cathode layer disposed on the light-emitting element layer;

a cathode protection layer disposed on the cathode layer;

a reflective metal layer disposed on the cathode protection layer;

and an encapsulation layer disposed on the reflective metal layer.

In one embodiment of the invention, the encapsulation layer includes:

a first silicon nitride layer disposed on the reflective metal layer;

a polymethylmethacrylate layer disposed on the first silicon nitride layer; and a second silicon nitride layer disposed on the polymethylmethacrylate layer.

In one embodiment of the invention, the cathode layer is made of a first highly reflective metal material, and the cathode layer has a thickness ranging from 50 to 100 nanometers; and the reflective metal layer is made of a second highly reflective metal material, and the reflective metal layer has a thickness ranging from 100 to 500 nanometers and has a reflectance more than 95%.

In one embodiment of the invention, the cathode protection layer is a lithium fluoride layer, and has a thickness ranging from 50 to 100 nanometers.

In one embodiment of the invention, the light-emitting element layer is a bottom-emission type light-emitting element layer.

Beneficial Effect

Compared with the prior art, the display structure of the present invention adds a reflective metal layer between an encapsulation layer and a reflective cathode layer, thereby increasing the light-emitting efficiency of the bottom-emission type OLED and enhancing the moisture and oxygen barrier ability of the OLED devices, and effectively improves the optical performance and moisture and oxygen resistance of the OLED display panel.

DRAWINGS

In order to make the above content of the present invention more comprehensible, the preferred embodiments describe in detail in conjunction with the accompanying drawings as follows.

DETAILED DESCRIPTION OF EMBODIMENTS

The following descriptions of the embodiments are made with reference to the attached drawings to illustrate specific embodiments in which the present invention can be implemented. Furthermore, the directional terms mentioned in the present invention include, for example, top, bottom, top, bottom, front, back, left, right, inside, outside, lateral, surrounding, center, horizontal, horizontal, vertical, vertical, axial, radial direction, uppermost layer or lowermost layer, etc., are only directions referring to the attached drawings. Therefore, the directional terms used are for explaining and understanding the present invention, but not intend to limit the present invention.

As used herein, the term "bottom-emission type" means that an anode layer of an OLED display panel is disposed near a substrate, a cathode layer is disposed away from the substrate, and light emits from a light-emitting layer of the OLED display panel and passes through the anode layer, then emits through the substrate.

Figure 1:
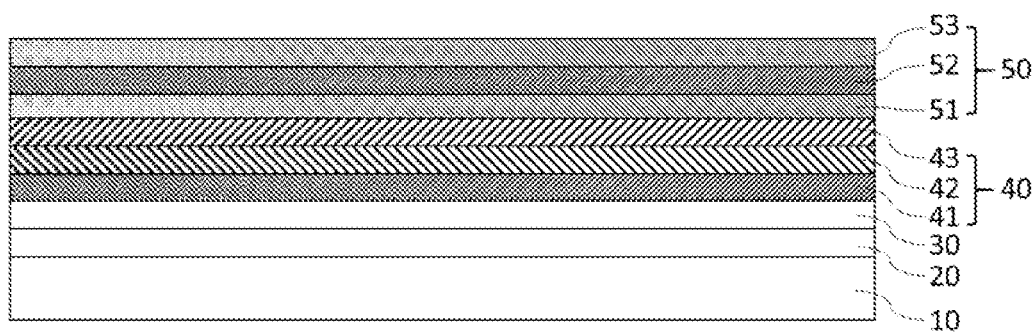
FIG. 1 is a schematic sectional view of a display structure according to a first embodiment of the present invention.

Referring to FIG. 1, in order to achieve the foregoing objects of the present invention, an embodiment of the present invention provides a display structure. The display structure includes: an array layer 10, a transparent anode layer 20 disposed on the array layer 10, a light-emitting element layer 30 disposed on the transparent anode layer 20, a light reflective layer 40 disposed on the light-emitting element layer 30, the light reflective layer 40 sequentially includes a reflective cathode layer 41, a cathode protection layer 42, and a reflective metal layer 43, and an encapsulation layer 50 disposed on the light reflective layer 40.

The detailed structure, assembly relationship and operation principle of the above elements in the first embodiment will be described in detail in the following with reference to FIG. 1.

Optionally, the array layer 10 includes a thin film transistor layer configured to control light emission of a plurality of light-emitting elements in the light-emitting element layer 30. In this embodiment, a flexible substrate layer is disposed on a rigid carrier in advance, and then the thin film transistor layer is disposed on the flexible substrate layer.

Optionally, the array layer 10 has a color filter layer configured to convert a light emitted by the plurality of light-emitting elements in the light-emitting element layer 30 into different wavelengths (for example, to convert blue light to red/green light) of light.

In this embodiment, the transparent anode layer 20 is made of indium tin oxide (ITO). Preferably, the transparent anode layer 20 has a thickness ranging from 50 to 100 nanometers.

The light-emitting element layer 30 further sequentially includes an electron transport layer, a light-emitting layer, and a hole transport layer. Electrons are injected from the reflective cathode layer 41 into the electron transport layer. Similarly, electron holes are injected from the transparent anode layer 20 into the hole transport layer, and the electrons and the electron holes recombine in the light-emitting layer and emit photons.

Optionally, the reflective cathode layer 41 is made of a first highly reflective metal material, for example, a metal having a high reflectivity, such as aluminum or silver. The reflective cathode layer 41 has a thickness ranging from 50 to 100 nanometers. When the light emitted from the light-emitting element layer 30, about 90% of the light can be reflected by the reflective cathode layer 41 to emit light toward the array layer 10.

Preferably, the cathode protection layer 42 is a lithium fluoride layer and has a thickness ranging from 50 to 100 nanometers. Optionally, the cathode protection layer 42 is formed by evaporation. A function of the cathode protection layer 42 is to protect the reflective cathode layer 41, so as to avoid damage to the reflective cathode layer 41 when the encapsulation layer 50 is formed. Moreover, another function of the cathode protection layer 42 is to separate the reflective metal layer 43 from the reflective cathode layer 41, so as to avoid a short circuit between the reflective metal layer 43 and the reflective cathode layer 41.

In addition, the reflective metal layer 43 is made of a second highly reflective metal material, for example, selected from a group consisting of aluminum, magnesium, silver, and an alloy thereof. The reflective metal layer 43 has a thickness ranging from 100 to 500 nanometers and a reflectivity more than 95%. The reflective cathode layer 41 and the reflective metal layer 43 can make a total reflectivity of the display structure of the present invention reach more than 95%, so that the light output efficiency can be improved.

Furthermore, the encapsulation layer 50 includes: a first silicon nitride layer 51 disposed on the reflective metal layer 43, a polymethyl-methacrylate layer 52 disposed on the first silicon nitride layer 51, and a second silicon nitride layer 53 disposed on the polymethyl-methacrylate layer 52. The first silicon nitride layer 51, the polymethyl-methacrylate layer 52, and the second silicon nitride layer 53 are prepared by a method, such as chemical vapor deposition or inkjet printing. The encapsulation layer 50 is a main moisture-oxygen barrier layer in the display structure of the present invention, and is used to prevent moisture and oxygen from invading the light-emitting element layer 30 from a lateral surface of the display structure. The reflective metal layer 43 also has a moisture-oxygen barrier property. Therefore, the structure of the reflective metal layer 43 in combination with the encapsulation layer 50 provided by the present invention can enhance the moisture-oxygen barrier performance of the display structure according to the present invention.

In this embodiment, the light-emitting element layer 30 is a bottom-emission type light-emitting element layer. It should be understood that a person of ordinary skill in the art can apply the embodiments of the present invention to a top-emission light-emitting device through appropriate modifications.

Figure 2:
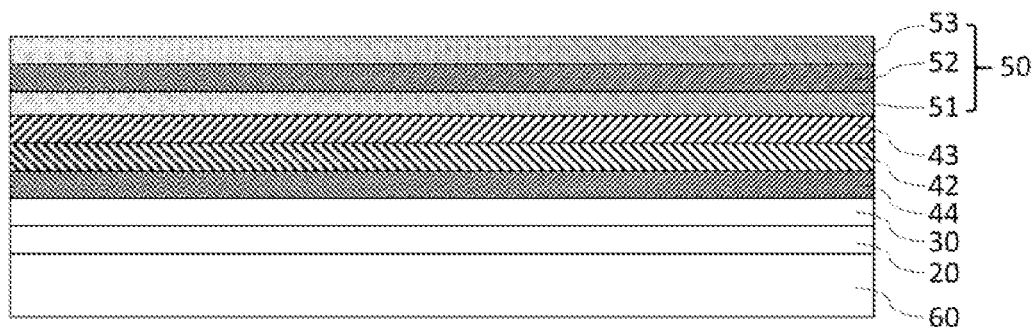
FIG. 2 is a schematic sectional view of a display structure according to a second embodiment of the present invention.

Referring to FIG. 2, which illustrates a display structure according to another embodiment of the present invention. The display structure includes: an array substrate 60, a transparent anode layer 20 disposed on the array substrate 60, a light-emitting element layer 30 disposed on the transparent anode layer 20, and a cathode layer 44 disposed on the light-emitting element layer 30, a cathode protection layer 42 disposed on the cathode layer 44, a reflective metal layer 43 disposed on the cathode protection layer 42, and an encapsulation layer 50 disposed on the reflective metal layer 43.

Optionally, the array substrate 60 has a thin film transistor layer configured to control light emission of a plurality of light-emitting elements in the light-emitting element layer 30.

Optionally, the array substrate 60 further has a color filter layer configured to convert a light emitted by the plurality of light-emitting elements in the light-emitting element layer 30 into different wavelengths (for example, to convert green light into red/blue light) of light.

In this embodiment, the transparent anode layer 20 is made of indium tin oxide (ITO). Preferably, the transparent anode layer 20 has a thickness ranging from 50 to 100 nanometers.

The light-emitting element layer 30 further sequentially includes an electron transport layer, a light-emitting layer, and a hole transport layer. Electrons are injected from the cathode layer 44 into the electron transport layer. Similarly, electron holes are injected from the transparent anode layer 20 into the hole transport layer, and the electrons and the electron holes recombine in the light-emitting layer to emit photons.

Optionally, the cathode layer 44 is made of a first highly reflective metal material, for example, a metal having a high reflectivity such as aluminum or silver. The cathode layer 44 has a thickness ranging from 50 to 100 nanometers.

Preferably, the cathode protection layer 42 is a lithium fluoride layer and has a thickness ranging from 50 to 100 nanometers. Optionally, the cathode protection layer 42 is formed by evaporation. A function of the cathode protection layer 42 is to protect the cathode layer 44, so as to avoid damage to the cathode layer 44 when the encapsulation layer 50 is formed. Moreover, another function of the cathode protection layer 42 is to separate the reflective metal layer 43 from the cathode layer 44, so as to avoid a short circuit between the reflective metal layer 43 and the cathode layer 44.

In addition, the reflective metal layer 43 is made of a second highly reflective metal material, for example, selected from a group consisting of aluminum, magnesium, silver, and an alloy thereof. The reflective metal layer 43 has a thickness ranging from 100 to 500 nanometers and a reflectivity more than 95%. The reflective metal layer 43 can make a total reflectivity of the display structure of the present invention reach more than 95%, so that the light output efficiency can be improved.

Furthermore, the encapsulation layer 50 includes: a first silicon nitride layer 51 disposed on the reflective metal layer 43, a polymethyl-methacrylate layer 52 disposed on the first silicon nitride layer 51, and a second silicon nitride layer 53 disposed on the polymethyl-methacrylate layer 52. The first silicon nitride layer 51, the polymethyl-methacrylate layer 52, and the second silicon nitride layer 53 are prepared by a method such as chemical vapor deposition or inkjet printing. The encapsulation layer 50 is a main moisture-oxygen barrier layer in the display structure of the present invention, and is used to prevent moisture and oxygen from invading the light-emitting element layer 30 from a lateral surface of the display structure. The reflective metal layer 43 also has a moisture-oxygen barrier property. Therefore, the structure of the reflective metal layer 43 in combination with the encapsulation layer 50 provided by the present invention can enhance the moisture-oxygen barrier performance of the display structure according to the present invention.

In this embodiment, the light-emitting element layer 30 is a bottom-emission type light-emitting element layer. It should be understood that a person of ordinary skill in the art can apply the embodiments of the present invention to a top-emission light-emitting device through appropriate modifications.

The present invention has been described by the above related embodiments, but the above embodiments are merely examples for implementing the present invention. It must be noted that the disclosed embodiments do not limit the scope of the invention. On the contrary, modifications and equivalent arrangements included in the spirit and scope of the claims are all included in the scope of the present invention.

The invention claimed is:

1. A display structure, comprising:
   an array layer;
   a transparent anode layer disposed on the array layer;
   a light-emitting element layer disposed on the transparent anode layer;
   a light reflective layer disposed on the light-emitting element layer, wherein the light
   reflective layer sequentially includes a reflective cathode layer, a cathode protection layer,
   and a reflective metal layer;
   a first silicon nitride layer disposed on the reflective metal layer;
   a polymethylmethacrylate layer disposed on the first silicon nitride layer; and
   a second silicon nitride layer disposed on the polymethylmethacrylate layer,
   wherein the reflective cathode layer is made of aluminum or silver, and the reflective cathode layer has a thickness ranging from 50 to 100 nanometers,
   wherein the reflective metal layer is made of selected from a group consisting of aluminum, magnesium, silver, and an alloy thereof, and the reflective metal layer has a thickness ranging from 100 to 500 nanometers,
   wherein the reflective cathode layer and the reflective metal layer make a total reflectivity of the display structure reach more than 95%.

2. The display structure according to claim 1, wherein the cathode protection layer is a lithium fluoride layer, and has a thickness ranging from 50 to 100 nanometers.

3. The display structure according to claim 1, wherein the light-emitting element layer is a bottom-emission type light-emitting element layer.

4. A display structure, comprising:
   an array layer;
   a transparent anode layer disposed on the array layer;
   a light-emitting element layer disposed on the transparent anode layer;
   a light reflective layer disposed on the light-emitting element layer, wherein the light
   reflective layer sequentially includes a reflective cathode layer, a cathode protection layer,
   and a reflective metal layer; and
   an encapsulation layer disposed on the light reflective layer,
   wherein the reflective cathode layer is made of aluminum or silver, and the reflective cathode layer has a thickness ranging from 50 to 100 nanometers,
   wherein the reflective metal layer is made of selected from a group consisting of aluminum, magnesium, silver, and an alloy thereof, and the reflective metal layer has a thickness ranging from 100 to 500 nanometers and has a reflectance more than 95%,
   wherein the reflective cathode layer and the reflective metal layer make a total reflectivity of the display structure reach more than 95%.

5. The display structure according to claim 4, wherein the encapsulation layer comprises:
   a first silicon nitride layer disposed on the reflective metal layer;
   a polymethylmethacrylate layer disposed on the first silicon nitride layer; and
   a second silicon nitride layer disposed on the polymethylmethacrylate layer.

6. The display structure according to claim 4, wherein the cathode protection layer is a lithium fluoride layer, and has a thickness ranging from 50 to 100 nanometers.

7. The display structure according to claim 4, wherein the light-emitting element layer is a bottom-emission type light-emitting element layer.

8. A display structure, comprising:
   an array substrate;
   a transparent anode layer disposed on the array substrate;
   a light-emitting element layer disposed on the transparent anode layer;
   a cathode layer disposed on the light-emitting element layer;
   a cathode protection layer disposed on the cathode layer;
   a reflective metal layer disposed on the cathode protection layer; and
   an encapsulation layer disposed on the reflective metal layer,
   wherein the cathode layer is made of aluminum or silver, and the cathode layer has a thickness ranging from 50 to 100 nanometers,
   wherein the reflective metal layer is made of selected from a group consisting of aluminum, magnesium, silver, and an alloy thereof, and the reflective metal layer has a thickness ranging from 100 to 500 nanometers,
   wherein the cathode layer and the reflective metal layer make a total reflectivity of the display structure reach more than 95%.

9. The display structure according to claim 8, wherein the encapsulation layer comprises:
   a first silicon nitride layer disposed on the reflective metal layer;
   a polymethylmethacrylate layer disposed on the first silicon nitride layer; and
   a second silicon nitride layer disposed on the polymethylmethacrylate layer.

10. The display structure according to claim 8, wherein the cathode protection layer is a lithium fluoride layer, and has a thickness ranging from 50 to 100 nanometers.

11. The display structure according to claim 8, wherein the light-emitting element layer is a bottom-emission type light-emitting element layer.

\* \* \* \* \*

UNITED STATES PATENT AND TRADEMARK OFFICE
CERTIFICATE OF CORRECTION

| | |
|---|---|
| PATENT NO. | : 11,417,859 B2 |
| APPLICATION NO. | : 16/644201 |
| DATED | : August 16, 2022 |
| INVENTOR(S) | : Zhao Li |

It is certified that error appears in the above-identified patent and that said Letters Patent is hereby corrected as shown below:

On the Title Page

Item (73) should be corrected as follows:
(73) Assignee: WUHAN CHINA STAR OPTOELECTRONICS SEMICONDUCTOR DISPLAY TECHNOLOGY CO., LTD., Hubei (CN)

Signed and Sealed this
Ninth Day of January, 2024

Katherine Kelly Vidal
*Director of the United States Patent and Trademark Office*